（12） United States Patent
Tan

(10) Patent No.: US 11,106,888 B2
(45) Date of Patent: Aug. 31, 2021

(54) DISPLAY DEVICE FOR FINGERPRINT IDENTIFICATION AND CONTROL METHOD THEREOF

(71) Applicant: BOE TECHNOLOGY GROUP CO., LTD., Beijing (CN)

(72) Inventor: Jifeng Tan, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 373 days.

(21) Appl. No.: 16/086,774

(22) PCT Filed: Mar. 2, 2018

(86) PCT No.: PCT/CN2018/077891
§ 371 (c)(1),
(2) Date: Sep. 20, 2018

(87) PCT Pub. No.: WO2018/188427
PCT Pub. Date: Oct. 18, 2018

(65) Prior Publication Data
US 2021/0027035 A1 Jan. 28, 2021

(30) Foreign Application Priority Data
Apr. 10, 2017 (CN) .......................... 201710229236.6

(51) Int. Cl.
*G06K 9/00* (2006.01)
*G02F 1/29* (2006.01)
(Continued)

(52) U.S. Cl.
CPC ............. *G06K 9/0004* (2013.01); *G02F 1/29* (2013.01); *G06K 9/2027* (2013.01);
(Continued)

(58) Field of Classification Search
CPC .. G06K 9/0004; G06K 9/00013; G06F 3/042; G06F 3/0421
See application file for complete search history.

(56) References Cited

U.S. PATENT DOCUMENTS

2006/0110013 A1 5/2006 Lee
2010/0053118 A1 3/2010 Chen
(Continued)

FOREIGN PATENT DOCUMENTS

CN 1627319 A 6/2005
CN 101762899 A 6/2010
(Continued)

OTHER PUBLICATIONS

Second Office Action for CN Appl. No. 201710229236.6, dated May 22, 2019.
(Continued)

*Primary Examiner* — Yuzhen Shen
(74) *Attorney, Agent, or Firm* — Dinsmore & Shohl LLP

(57) ABSTRACT

The embodiments of this disclosure provide a display device and a control method thereof. The display device comprises a display panel including a plurality of photosensitive sensing units and the display device further comprising: a light-transmitting hole forming layer, a liquid crystal lens layer, and a light guide layer arranged on a display side of the display panel and in sequence in a direction away from the display panel, and a light source arranged on a side of the light guide layer. The light-transmitting hole forming layer is switchable between a light-transmitting state and a pinhole state, in which the light-transmitting hole forming layer forms light-transmitting holes facing each photosensitive sensing unit; the liquid crystal lens layer is switchable between a non-lens state and a lens state, in which the liquid crystal lens layer forms a convex lens facing each of the photosensitive sensing units.

10 Claims, 6 Drawing Sheets

(51) Int. Cl.
*G06K 9/20* (2006.01)
*G09G 3/36* (2006.01)
*H01L 27/146* (2006.01)
*F21V 8/00* (2006.01)
*G09G 3/3225* (2016.01)

(52) U.S. Cl.
CPC ..... *G09G 3/3648* (2013.01); *H01L 27/14605* (2013.01); *G02B 6/0091* (2013.01); *G09G 3/3225* (2013.01); *G09G 2360/14* (2013.01); *H01L 27/14623* (2013.01)

(56) References Cited

U.S. PATENT DOCUMENTS

| | | | | |
|---|---|---|---|---|
| 2010/0142770 | A1* | 6/2010 | Hayasaka | G06K 9/00013 382/124 |
| 2011/0069254 | A1* | 3/2011 | Takama | G02B 3/14 349/62 |
| 2011/0234537 | A1* | 9/2011 | Kim | G06F 3/0421 345/175 |
| 2011/0255046 | A1* | 10/2011 | Kurokawa | G09G 3/3648 349/140 |
| 2014/0125893 | A1* | 5/2014 | Wu | G02F 1/13394 349/15 |

FOREIGN PATENT DOCUMENTS

| | | | |
|---|---|---|---|
| CN | 203838722 U | 9/2014 | |
| CN | 104182727 A | 12/2014 | |
| CN | 204028936 U | * 12/2014 | ........... G06K 9/0004 |
| CN | 105184248 A | 12/2015 | |
| CN | 105868742 | 8/2016 | |
| CN | 106022324 A | 10/2016 | |
| CN | 106526944 A | 3/2017 | |
| CN | 106873284 A | 6/2017 | |

OTHER PUBLICATIONS

First Office Action for CN Appl. No. 201710229236.6, dated Dec. 11, 2018.
International Search Report and Written Opinion for International Appl. No. PCT/CN2018/077891, dated Jun. 8, 2018.

* cited by examiner

DISPLAY DEVICE FOR FINGERPRINT IDENTIFICATION AND CONTROL METHOD THEREOF

CROSS-REFERENCE TO RELATED APPLICATIONS

This application is a U.S. National Stage under 35 U.S.C. § 371 of International Application No. PCT/CN2018/077891 as filed on Mar. 2, 2018, which claims the priority to the Chinese Patent application No. 201710229236.6, filed on Apr. 10, 2017. The disclosures of each of these applications the entire contents of which are hereby incorporated herein by reference in their entirety into as part of this application.

TECHNICAL FIELD

This disclosure relates to a display device and a control method thereof.

BACKGROUND

With the development of fingerprint identification technologies, these technologies are widely used in devices such as mobile phones, tablet computers, televisions, access control, and safes. Fingerprint identification technologies mainly comprise optical, capacitive, and ultrasonic technologies, wherein the optical fingerprint identification technology has a wider identification range and a lower cost.

SUMMARY

Embodiments of this disclosure provide a display device, comprising a display panel including a plurality of photosensitive sensing units, and the display device further comprising: a light-transmitting hole forming layer, a liquid crystal lens layer, and a light guide layer arranged in this order on a display side of the display panel and in a direction away from the display panel, and a light source arranged on a side of the light guide layer.

The light-transmitting hole forming layer is switchable between a light-transmitting state and a pinhole state, wherein the pinhole state is a state in which the light-transmitting hole forming layer form light-transmitting holes facing each photosensitive sensing unit; the liquid crystal lens layer is switchable between a non-lens state and a lens state, wherein the lens state is a state in which the liquid crystal lens layer forms convex lenses facing each photosensitive sensing unit.

In one or more embodiments, a center of each photosensitive sensing unit, a center of the light-transmitting hole facing the photosensitive sensing unit, and a center of the convex lens facing the photosensitive sensing unit are on a same vertical connection line.

In one or more embodiments, the light emitted by the light source enters the light guide layer and is incident to an upper bottom surface and a lower bottom surface of the light guide layer, and a degree of an incidence angle of the light incident to the upper bottom surface and the lower bottom surface of the light guide layer is greater than or equal to a degree of a critical angle of the light guide layer.

In one or more embodiments, the light-transmitting hole forming layer comprises a first liquid crystal layer sealed in a first cavity, and a first pixel electrode and a first common electrode for driving the first liquid crystal layer, wherein the first pixel electrode and the first common electrode are at least arranged in a region other than the light-transmitting hole.

In one or more embodiments, the liquid crystal lens layer comprises a second liquid crystal layer sealed in a second cavity, and a second pixel electrode and a second common electrode for driving the second liquid crystal layer; wherein the second pixel electrode and the second common electrode are used for driving the second liquid crystal layer to be switched between the non-lens state and the lens state.

In one or more embodiments, the display panel comprises a first substrate and a second substrate arranged in a cell aligned manner, wherein the second substrate is arranged nearer the light-transmitting hole forming layer than the first substrate, wherein the plurality of photosensitive sensing units are arranged on the second substrate.

In one or more embodiments, the plurality of photosensitive sensing units are evenly distributed in an array, a total region occupied by the plurality of photosensitive sensing units in the display panel is a sensing region, and a region in the display region of the display panel other than the sensing region is a light exit region. An area ratio of the sensing region to the light exit region can be greater than or equal to 1:4, and less than or equal to 1:1.

In one or more embodiments, an area ratio of a region occupied by each photosensitive sensing unit in the display panel to a pixel region or sub-pixel region of the display panel can be greater than or equal to 1:4, and less than or equal to 1:1.

In one or more embodiments, in case where a center of each of the photosensitive sensing units, a center of the light-transmitting hole facing the photosensitive sensing unit, and a center of the convex lens facing the photosensitive sensing unit are on a same vertical connection line, when the liquid crystal lens layer is in a lens state, adjacent convex lenses are arranged to adjoin one another in a direction parallel to the display panel.

In one or more embodiments, an aperture of each of the convex lens is D0, a vertical distance from the center of the convex lens to the center of the light-transmitting hole facing the convex lens is H0, and a vertical distance from the center of the light-transmitting hole to the photosensitive sensing unit facing the light-transmitting hole is H1, and a width range of the photosensitive sensing unit is greater than or equal to $$\frac{D0 \cdot H1}{H0}$$

where $$\frac{H1}{H0} \leq 1.$$

In one or more embodiments, the photosensitive sensing unit further comprises a light blocking layer arranged on a side of each of said photosensitive sensing units away from the light-transmitting hole forming layer.

Embodiments of this disclosure provide a control method of the display device as described in the first aspect, wherein the display device comprises a control module; after the control module receives a fingerprint identification signal, it controls the light-transmitting hole forming layer in a fingerprint identification region to be switched to a pinhole state and the liquid crystal lens layer to be switched to a lens state, and causes the display device to perform fingerprint identification based on the light guide layer, the light source arranged on a side of the light guide layer, and the plurality of photosensitive sensing units; after the control module receives a display signal, it controls the light-transmitting hole forming layer to be switched to a light-transmitting state and the liquid crystal lens layer to be switched to a non-lens state, and causes the display device to perform display.

BRIEF DESCRIPTION OF THE DRAWINGS

To describe the technical solutions in the embodiments of this disclosure more clearly, the accompanying drawings used in the description of the embodiments are briefly introduced in the following. Evidently, the accompanying drawings are only some embodiments of this disclosure, and persons of ordinary skill in the art can also obtain other drawings according to these accompanying drawings without creative efforts.

DETAILED DESCRIPTION

The technical solutions in the embodiments of this disclosure are clearly and completely described in the following with reference to the accompanying drawings in the embodiments of the present invention. Evidently, the embodiments in the following description are only a part rather than all of the embodiments of this disclosure. Based on the embodiments of this disclosure, all other embodiments obtained by persons of ordinary skill in the art without creative efforts shall fall within the protection scope of this disclosure.

Figure 1:
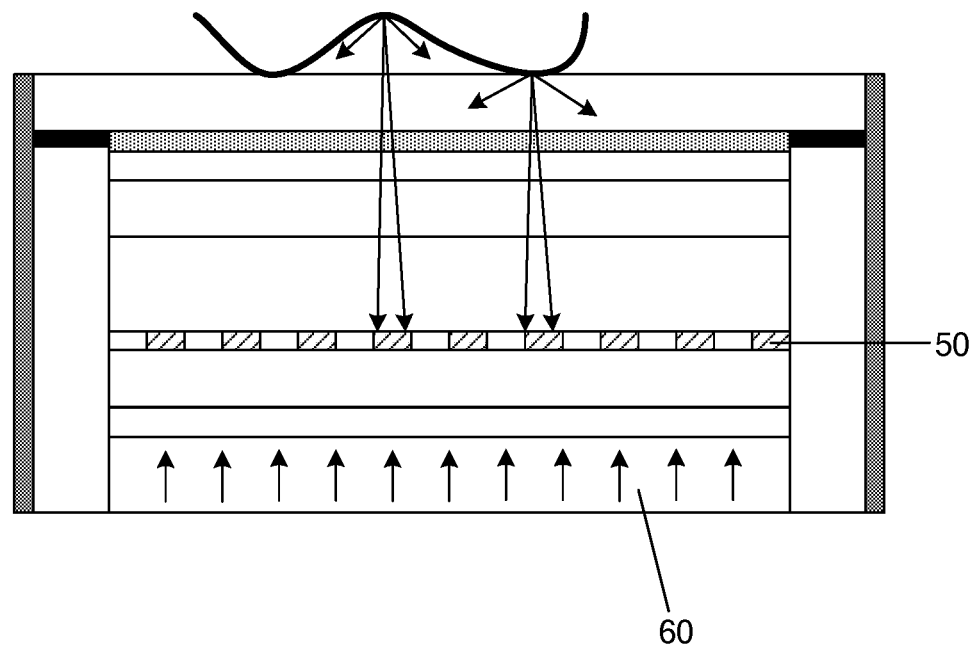
FIG. 1 is a diagram showing a structure of a display device provided in related technologies.

As shown in FIG. 1, a plurality of photoelectric sensors 50 are provided in a related optical fingerprint identifier. After the light emitted by a backlight source 60 illuminates a finger, the light beam is diffusely reflected through the finger, wherein a part of the light beam is absorbed by the photoelectric sensor 50. While the light beam is diffusely reflected by a trough (hereinafter referred to as valley) and a crest (hereinafter referred to as ridge) of the finger, there is a difference in the light energies of the reflected light. The light energy of the light beam reflected by the valley is lower than the light energy of the light beam reflected by the ridge, and the photoelectric sensor 50 can perform fingerprint identification based on the difference in the received light energies.

However, since the photoelectric sensor 50 only receives a very small part of the light beam diffusely reflected by the finger, and the difference in the reflected light energies reflected by the valley and ridge of the finger is very small, it is unfavorable for the photoelectric sensor 50 to determine a relative position of the valley and ridge. Meanwhile, in the case that there is ambient light interference between the valley and ridge of the finger, it is also unfavorable for the photoelectric sensor 50 to perform accurate fingerprint identification.

Figure 2:
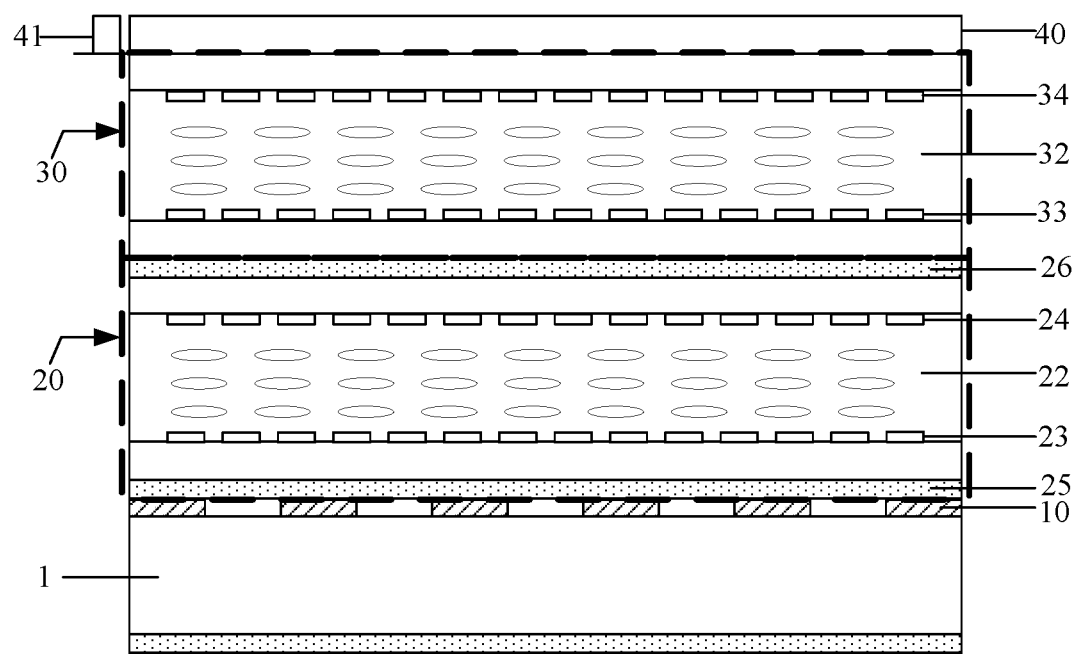
FIG. 2 is a diagram showing a structure of a display device provided in an embodiment of this disclosure.
Figure 3:
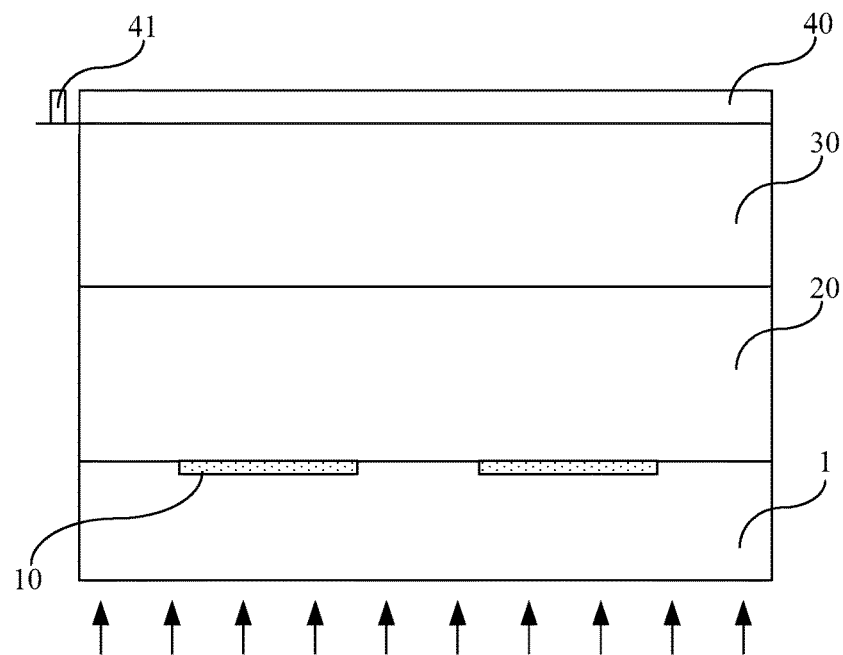
FIG. 3 is a schematic diagram showing a display device for display provided in an embodiment of this disclosure.
Figure 4:
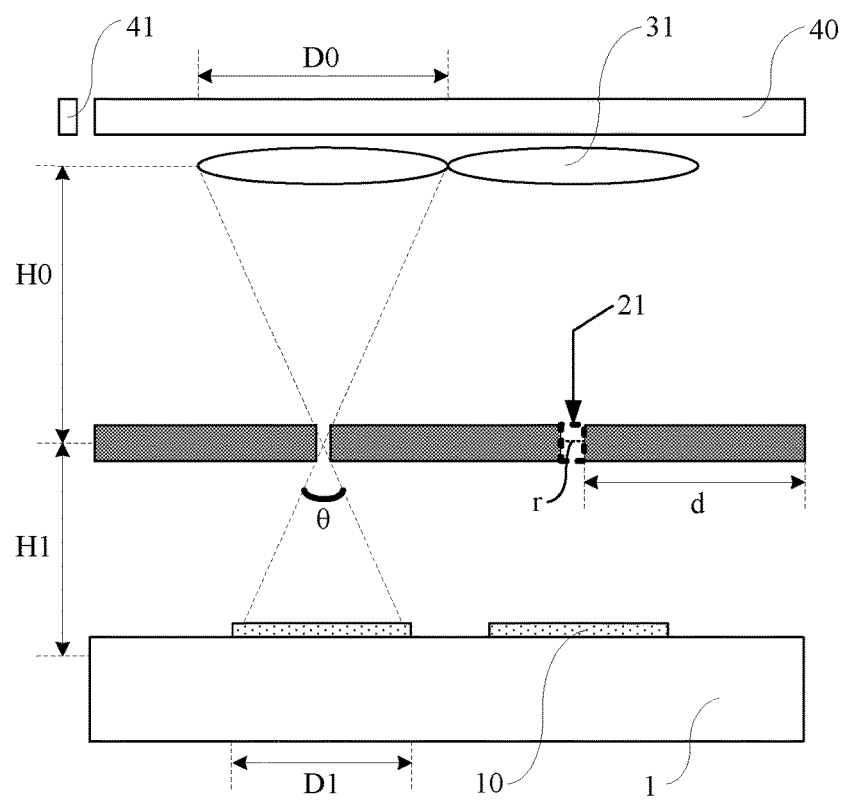
FIG. 4 is a schematic diagram showing a display device for fingerprint identification provided in an embodiment of this disclosure.

Embodiments of this disclosure provide a display device, as shown in FIGS. 2-4, comprising a display panel 1 including a plurality of photosensitive sensing units 10. The display device further comprises: a light-transmitting hole forming layer 20, a liquid crystal lens layer 30, and a light guide layer 40 arranged on a display side of the display panel 1 and in sequence in a direction away from the display panel 1, and a light source 41 arranged on a side of the light guide layer 40.

The light-transmitting hole forming layer 20 is switchable between a light-transmitting state (as shown in FIG. 3) and a pinhole state (as shown in FIG. 4). The pinhole state is a state in which the light-transmitting hole forming layer 20 forms a light-transmitting hole 21 facing each photosensitive sensing unit 10. The liquid crystal lens layer 30 is switchable between a non-lens state (as shown in FIG. 3) and a lens state (as shown in FIG. 4). The lens state is a state in which the liquid crystal lens layer 30 forms a convex lens 31 facing each photosensitive sensing unit 10. The light guide layer 40 has smooth upper bottom surface and lower bottom surface.

Here, in order to prevent the light for display from interfering with the light incident to the plurality of photosensitive sensing unit 10 for fingerprint identification, each photosensitive sensing unit 10 comprises a light blocking layer in addition to a photosensitive sensing unit body. The light blocking layer is arranged on a side of each photosensitive sensing unit body away from the light-transmitting hole forming layer 20. The photosensitive sensing unit body can include sensitive elements, conversion elements and so on. In one or more embodiments, the photosensitive sensing unit body comprises transmitters, receivers and detection circuits etc.

It should be noted that, firstly, the display device can be used for identifying objects to be identified having textures such as fingerprints, palm prints, which is not limited in this disclosure. For the sake of description, fingerprint identification is described in detail in the following.

Secondly, the photosensitive sensing unit 10 is used for converting optical signals into electrical signals, and can be a photosensitive sensor, a photoelectric sensor or the like. When the photosensitive sensing unit 10 is a photosensitive sensor, the structure of the photosensitive sensor can be a PIN (Positive-Intrinsic-Negative, briefly referred to as a junction photodiode) structure. In one or more embodiments, the structure of the photosensitive sensor can be a PN (Positive-Negative junction, briefly referred to as a photosensitive diode) and so on.

Thirdly, the arrangement of the plurality of photosensitive sensing units 10 is not limited in this disclosure. The plurality of photosensitive sensing units 10 can be arranged in any way as long as fingerprint identification is enabled when the finger touches any position in the fingerprint identification region on the display side of the display device, and an area occupied by the plurality of photosensitive sensing units 10 does not affect normal display of the display device. Adjacent photosensitive sensing units 10 can be arranged to adjoin one another (that is, there is no area for light exit between two photosensitive sensing units), and can also be arranged at intervals (that is, two photosensitive sensing units are spaced apart by an area for light exit). In one or more embodiments, every two adjacent photosensitive sensing units 10 in the display device are arranged at intervals. In one or more embodiments, adjacent photosensitive sensing units 10 in the display device can be arranged either to adjoin one another, or at intervals, and the photosensitive sensing units 10 arranged to adjoin one another do not affect normal display of the display device.

Fourthly, the center of each photosensitive sensing unit 10 and the center of the light-transmitting hole 21 facing it can be on a vertical connection line, or otherwise, they may not be on a vertical connection line, as long as an orthographical projection of a light-transmitting hole 21 on the display panel 1 overlaps an orthographical projection of the corresponding photosensitive sensing unit 10 on the display panel 1 (including full overlapping and partial overlapping).

The center of each photosensitive sensing unit 10 and the center of the convex lens 31 facing it can be on a vertical connection line, or otherwise, they may not be on a vertical connection line, as long as an orthographical projection of a convex lens 31 on the display panel 1 overlaps an orthographical projection of the corresponding photosensitive sensing unit 10 on the display panel 1 (including full overlapping and partial overlapping).

Generally the display panel 1 has parallel upper and lower surfaces. The orthographical projection on the display panel 1 refers to projections of the convex lens 31, the light-transmitting hole 21, and the photosensitive sensing unit 10 on the upper and lower surfaces of the display panel 1, in a direction perpendicular to the upper and lower surfaces of the display panel 1.

Fifthly, the formation of the light-transmitting hole forming layer 20 is not limited, as long as the light-transmitting hole forming layer 20 is switchable between the light-transmitting state and the pinhole state. For example, the light-transmitting hole forming layer 20 is formed by means of liquid crystal driven by electrodes, or by use of electrophoresis technology. Those skilled in the art would appreciate that, the pinhole state of the light-transmitting hole forming layer 20 is a state of forming a light-transmitting holes 21 that allow light to pass through, which means that light transmits through an area where the light-transmitting hole 21 is located but is blocked in other areas. The light-transmitting state of the light-transmitting hole forming layer 20, as the name implies, is a state of allowing light to transmit therethrough, that is, a state-variable area in the light-transmitting hole forming layer 20 becomes a light-transmitting state. An example of a "state-variable area" is a light blocking area other than the light-transmitting hole 21, when the light-transmitting hole forming layer 20 is switched to the pinhole state.

Those skilled in the art would appreciate that, the lens state of the liquid crystal lens layer 30 is a state of forming a convex lens 31, which means that light is gathered by an area where the convex lens 31 is located, but the other areas are in a light transmitting or blocking state according to a different in the deflections of the liquid crystal. In order that the display device can be used for display, the non-lens state of the liquid crystal lens layer 30 shall be a state of allowing the light to transmit through, i.e., in a non-lens state, all areas of the liquid crystal lens layer 30 turn into light-transmitting states.

Sixthly, a bottom surface on a side of the light guide layer 40 near the display panel 1 is a lower bottom surface, and a bottom surface on a side away from the display panel 1 is an upper bottom surface, and a plurality of surfaces adjoining between the upper bottom surface and the lower bottom surface are a plurality of side surfaces of the light guide layer 40. The light source 41 can be arranged on a side surface of the light guide layer 40, or on a plurality of side surfaces of the light guide layer 40.

Seventhly, the light guide layer 40 can comprise grids or not. If the light guide layer 40 does not comprise grids, the light emitted by the light source 41 enters the light guide layer 40 from a side of the light guide layer 40, a part of the light is totally reflected within the light guide layer 40, and a part of the light exits from the upper bottom surface of the light guide layer 40. When the finger touches the display device, the light exiting from the upper bottom surface of the light guide layer 40 is incident to the finger, and diffusely reflected by the finger to a plurality of photosensitive sensing units 10, so as to achieve fingerprint identification. If the light guide layer 40 comprises grids, the light emitted by the light source 41 enters the light guide layer 40 from a side of the light guide layer 40, and exits from the upper bottom surface of the light guide layer 40. When the finger touches the display device, the light exiting from the upper bottom surface of the light guide layer 40 is incident to the finger, and diffusely reflected by the finger to a plurality of photosensitive sensing units 10, so as to achieve fingerprint identification.

Eighthly, the material of the light guide layer 40 is not limited, and it can be polymethyl methacrylate (PMMA), thermoplastic resin of cyclohexene, polycarbonate (PC) and other resin materials. The thermoplastic resin of cyclohexene can be a cyclic olefin polymer (COP).

Figure 6A:
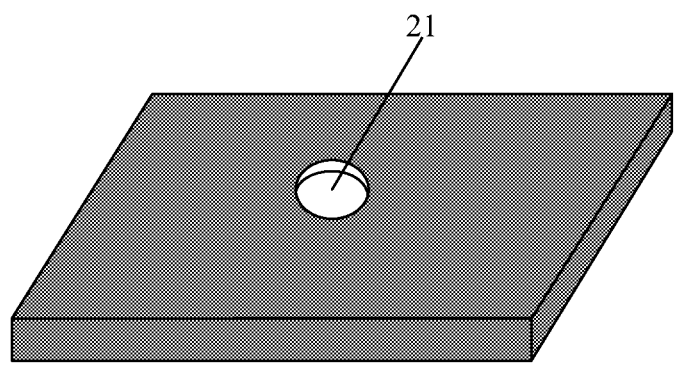
FIG. 6(a) is a first diagram showing a light-transmitting hole provided in an embodiment of this disclosure.
Figure 6B:
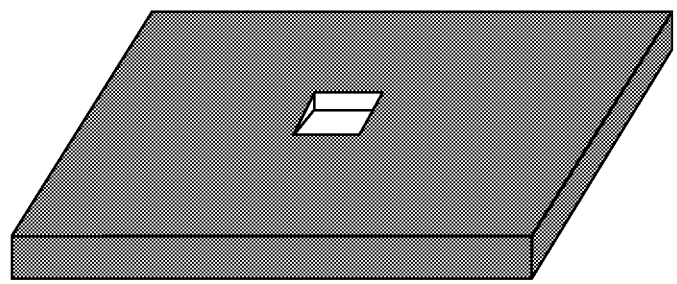
FIG. 6(b) is a second schematic diagram showing a light-transmitting hole provided in an embodiment of this disclosure.
Figure 7A:
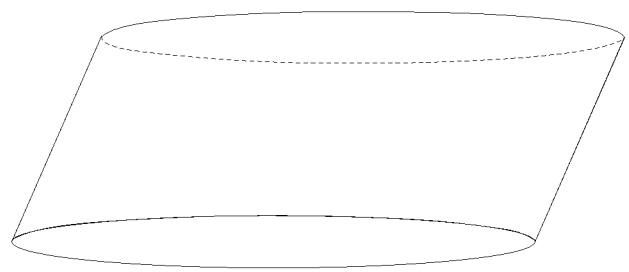
FIG. 7(a) is a first diagram showing a convex lens provided in an embodiment of this disclosure.
Figure 7B:
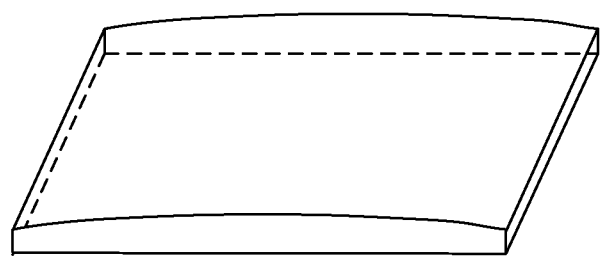
FIG. 7(b) is a second diagram showing a convex lens provided in an embodiment of this disclosure.

Ninthly, the shapes of the orthographical projections of the light-transmitting hole 21 and the convex lens 31 on the lower bottom surface of the light guide layer 40 are not limited, and for example, as shown in FIGS. 6(*a*) and 6(*b*), the orthographical projection of the light-transmitting hole 21 on the lower bottom surface of the light guide layer 40 can be rectangular, circular, elliptical (not shown in the figure), etc. As shown in FIGS. 7(*a*) and 7(*b*), the orthographical projection of the convex lens 31 on the lower bottom surface of the light guide layer 40 can be rectangular, circular (not shown in the picture), elliptical (not shown in the figure) etc. In one or more embodiments, the orthographical projections of the convex lens 31 and the light-transmitting hole 21 on the lower bottom surface of the light guide layer 40 are circular.

Tenthly, the display device can be a liquid crystal display, or an OLED (Organic Light-Emitting Diode) display.

When the display device is a liquid crystal display, it comprises a display panel 1 and a backlight source. The backlight source provides the display device with a light source for display. The display panel 1 comprises an array substrate, a cell-aligned substrate, and a liquid crystal layer arranged therebetween. The array substrate can comprise a TFT (Thin Film Transistor), and pixel electrodes electrically connected with a drain electrode of the TFT. The array substrate can further comprise a common electrode. The cell-aligned substrate can comprise a black matrix and a color film. Here, the color film can be arranged on the cell-aligned substrate, or on the array substrate. The common electrodes can be arranged on the array substrate or on the cell-aligned substrate. On this basis, the liquid crystal display device can also comprise polarizers respectively arranged on sides of the display panel 1 near and away from the backlight source.

When the display device is an OLED, since the OLED is a self-luminescent device, it can provide itself with a light source for display. The OLED comprises an array substrate and a package substrate. The array substrate can comprise a TFT, an anode electrically connected to a drain electrode of the TFT, a cathode, and an organic material functional layer between the anode and the cathode.

Embodiments of this disclosure provide a display device comprising a light-transmitting hole forming layer 20, a liquid crystal lens layer 30, and a light guide layer 40 arranged on a display side of the display panel 1 and in sequence in a direction away from the display panel 1, and a light source 41 arranged on a side of the light guide layer 40. When the display device is used only for display, the light-transmitting hole forming layer 20 is switched to the light-transmitting state, the liquid crystal lens layer 30 is switched to the non-lens state, to cause the display device to display. When the display device is used for fingerprint identification, the light-transmitting hole forming layer 20 in the fingerprint identification region can be switched to the pinhole state, the liquid crystal lens layer 30 can be switched to the lens state, and other regions in the display region of the display panel 1 other than the fingerprint identification region still can be used for normal display. The light emitted by the light source 41 is incident from the light guide layer 40 to the finger, diffusely reflected by the finger, and then gathered by the convex lens 31 of the liquid crystal lens layer 30, thereby increasing the light energy from the valley and ridge. With the increase of the light energy from the valley and ridge, a difference between the light energies from them increases as well. The light passing through the convex lens 31 then passes through the light-transmitting hole 21 of the light-transmitting hole forming layer 20, so that the gathered light is incident to a plurality of photosensitive sensing units 10 through the light-transmitting hole 21. Thus, light interference from the areas other than the light-transmitting hole 21 can be eliminated. By increasing the difference in the light energies between the valley and ridge, and eliminating the light interference from the areas other than the light-transmitting hole 21, the present disclosure can accurately identify the fingerprint.

On this basis, in considering the fact that at least one surface in the convex lens 31 are curved surfaces, and among all curved surfaces, the spherical surface is most suitable for mass production and is easily machined to a high precision, in one or more embodiments, the convex lens 31 is a spherical lens. In one or more embodiments, as shown in FIG. 4, the center of each photosensitive sensing unit 10, the center of the light-transmitting hole 21 facing the photosensitive sensing unit 10, and the center of the convex lens 31 facing the photosensitive sensing unit 10 are on the same vertical connection line.

In the embodiment of this disclosure, by setting the center of the convex lens 31 facing the photosensitive sensing unit 10 and the center of the light-transmitting hole 21 facing the photosensitive sensing unit 10 on the same vertical connection line, the light passing through the light-transmitting hole 21 only includes the light gathered by the convex lens 31, such that the photosensitive sensing unit 10 can completely eliminate the interference from the light other than the gathered light. In considering the case where adjacent photosensitive sensing units 10 are arranged to adjoin one another, in order to make the light incident to a plane where the photosensitive sensing unit 10 is located not overlap, the light passing through the light-transmitting hole 21 is totally incident to the photosensitive sensing unit 10 facing it. Therefore, the center of the photosensitive sensing unit 10 and the center of the light-transmitting hole 21 facing the photosensitive sensing unit 10 are on the same vertical connection line, which can reduce the width of the photosensitive sensing unit 10, so as to avoid the influence to an aperture ratio of the display device by a too large width of the photosensitive sensing unit 10.

In one or more embodiments, the light emitted by the light source 41 enters the light guide layer 40, and is incident to the upper and lower bottom surfaces of the light guide layer 40. The degree of the incidence angle of the light incident to the upper and lower bottom surfaces of the light guide layer 40 is greater than or equal to the degree of the critical angle of the light guide layer 40.

It should be noted that, those skilled in the art would appreciate that, when the light is incident from an optically dense medium to an optically thinner medium, if the degree of the incidence angle of the light in the optically dense medium increases to a certain value, then the degree of an refraction angle of the light in the optically thinner medium will reach 90°, and at this time, the refracted light will not appear in the optically thinner medium and will be reflected within the optically dense medium. This phenomenon is called a total reflection phenomenon. When the degree of the refraction angle of the light in the optically thinner medium is 90°, the degree of the incidence angle of the light in the optically dense medium is the degree of the critical angle, and if the degree of the incidence angle of the light in the optically dense medium is greater than or equal to the degree of the critical angle, then the light is totally reflected within the optically dense medium.

Figure 5:
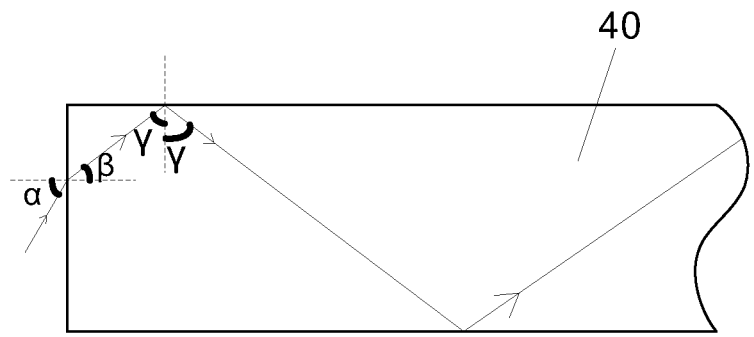
FIG. 5 is a diagram showing a light path of the light in the light guide layer, provided in an embodiment of this disclosure.

In the embodiment of this disclosure, as shown in FIG. 5, the light is incident from the light source 41 to the light guide layer 40, and then to the air or reflected within the light guide layer 40. The light guide layer 40 can be regarded as an optically dense medium, the air can be regarded as an optical thinner medium, and the incidence angle γ of the light incident to the upper and lower bottom surfaces of the light guide layer 40 is an incidence angle of the light in the optically dense medium. Therefore, when the degree of the incidence angle γ of the light incident to the upper and lower bottom surfaces of the light guide layer 40 is greater than or equal to the degree of the critical angle of the light guide layer 40, the light is totally reflected within the light guide layer 40. At this time, when the display device is used only for display, the light that the human eyes see is only the light used by the display device for display. When the display device is used for fingerprint identification, the finger touches the display device, and the light guide layer 40 is applied by forces such that a deformation occurs in the finger touch position, thereby destroying the total reflection of the light within the light guide layer 40. Thereafter, the light exits from the light guide layer 40 to the finger and diffusely reflected by the finger to a plurality of photosensitive sensing units 10, so as to achieve fingerprint identification (FIG. 5 shows only that the light is incident to the upper bottom surface of the light guide layer, where α, β and γ is in a range of value greater than or equal to 0°, and less than or equal to 90°).

Here, if the refractive index of the light guide layer 40 is greater than or equal to $\sqrt{2}$, then the degree γ of the incidence angle of the light incident to the upper and lower bottom surfaces of the light guide layer 40 can be greater than or equal to the degree of the critical angle of the light guide layer 40. Otherwise, by changing the degree α of the incidence angle of the light emitted by the light source 41 to the light guide layer 40, the degree γ of the incidence angle of the light incident to the upper and lower bottom surfaces of the light guide layer 40 can be greater than or equal to the degree of the critical angle of the light guide layer 40.

Illustratively, as shown in FIG. 5, if the material of the light guide layer 40 is polymethyl methacrylate (PMMA), the refractive index is n=1.49, sin 90°=1, then the degree of the critical angle is $$\arcsin\left(\frac{1}{1.49}\right) \approx 42.2°.$$

Therefore, it is sufficient if the degree γ of the incidence angle of the light incident to the upper and lower bottom surfaces of the light guide layer 40 is greater than or equal to 42.2° i.e., γ≥42.2°.

As can be seen from FIG. 5, a sum of the degree β of the refraction angle of the light emitted by the light source 41 to the light guide layer 40 and the degree γ of the incidence angle of the light incident to the upper and lower bottom surfaces of the light guide layer 40 is 90°, i.e., β+γ=90°. Therefore, 90°−β≥42.2°, and β≤47.8°.

On this basis, it is known that the refractive index n of the light guide layer 40, and the degree β of the refraction angle of the light emitted by the light source 41 to the light guide layer 40 are known, and then the degree α of the incidence angle of the light emitted by the light source 41 to the light guide layer 40 can be solved. In the case that sin 47.8°≈0.74, according to the refractive index equation $$\frac{\sin\alpha}{\sin\beta} = n,$$

it can be derived that sin α≤0.74*1.49=1.1026.

It is known that α is in a range of 0≤α≤90°, sin α is in a range of 0≤sin α≤1, and the range of sin α is within the calculated result 1.1026, therefore, when the light guide layer 40 has a refractive index of 1.49, for all the light emitted by the light source 41 into the light guide layer 40, it can be achieved that the degree γ of the incidence angle of the light incident to the upper and lower bottom surfaces of the light guide layer 40 is greater than or equal to the degree of the critical angle, such that all the light emitted from the light source 41 to the upper and lower bottom surfaces of the light guide layer 40 can be totally reflected within the light guide layer 40.

In the embodiments of this disclosure, by making the degree γ of the incidence angle of the light incident to the upper and lower bottom surfaces of the light guide layer 40 greater than or equal to the degree of the critical angle of the light guide layer 40, when the display device is used only for display, the light that the human eyes see is only the light used by the display device for display, which prevents the light exiting from the upper bottom surface of the light guide layer 40 from affecting a contrast of a picture displayed by the display device. However, when the display device is used for fingerprint identification, the finger touches the display device, and the light guide layer 40 is applied by forces such that a deformation occurs in the finger touch position, thereby destroying the total reflection of the light within the light guide layer 40. The light exits from the light guide layer 40 to the finger, and diffusely reflected by the finger to a plurality of photosensitive sensing units 10, so as to achieve fingerprint identification.

In one or more embodiments, as shown in FIG. 2, the light-transmitting hole forming layer 20 comprises a first liquid crystal layer 22 sealed in a first cavity, and a first pixel electrode 23 and a first common electrode 24 for driving the first liquid crystal layer 22. The first pixel electrode 23 and the first common electrode 24 are arranged at least in an area other than the light-transmitting hole 21.

Here, the light-transmitting hole forming layer 20 further comprises a first polarizer 25 arranged on a side of the first cavity near the display panel 1 and a second polarizer 26 arranged on a side of the first cavity away from the display panel. In one or more embodiments, the liquid crystal in the first liquid crystal layer 22 is a cholesteatoma liquid crystal or PDLC (Polymer Dispersed Liquid Crystal).

In addition, the light-transmitting hole forming layer 20 further comprises a third substrate arranged on a side of the first liquid layer 22 near the display panel 1 and a fourth substrate arranged on a side of the first liquid layer 22 away from the display panel 1.

It should be noted that, according to a difference of the relative position of the transmission axes of the first polarizer 25 and the second polarizer 26 and a difference of the operating mode of the light-transmitting hole forming layer 20, it can be specifically classified into the following two cases:

First case: the transmission axes of the first polarizer 25 and the second polarizer 26 are vertically designed.

When the light-transmitting hole forming layer 20 forms a light-transmitting hole 21 in a TN (Twisted Nematic) mode, the light-transmitting hole forming layer 20 is in a white state in the case of being powered off, and is in a black state in the case of being powered on. When the light-transmitting hole forming layer 20 is switched to the pinhole state, in an area where the light-transmitting hole 21 is located, there is no voltage between the first pixel electrode 23 and the first common electrode 24, so that the light is allowed to pass through such area. In an area other than the light-transmitting hole 21, there is a voltage between the first pixel electrode 23 and the first common electrode 24, so that the light is blocked in such area.

When the light-transmitting hole forming layer 20 forms a light-transmitting hole 21 in an ADS (Advanced Super Dimension Switch) mode, the light-transmitting hole forming layer 20 is in a black state in the case of being powered off, and is in a white state in the case of being powered on. When the light-transmitting hole forming layer 20 is switched to the pinhole state, in an area where the light-transmitting hole 21 is located, there is a voltage between the first pixel electrode 23 and the first common electrode 24, so that the light is allowed to pass through such area. In an area other than the light-transmitting hole 21, there is no voltage between the first pixel electrode 23 and the first common electrode 24, so that the light is blocked in such area.

Second case: the transmission axes of the first polarizer 25 and the second polarizer 26 are designed in parallel.

When the light-transmitting hole forming layer 20 forms a light-transmitting hole 21 in a TN (Twisted Nematic) mode, the light-transmitting hole forming layer 20 is in a black state in the case of being powered off, and is in a white state in the case of being powered on. When the light-transmitting hole forming layer 20 is switched to the pinhole state, in an area where the light-transmitting hole 21 is located, there is a voltage between the first pixel electrode 23 and the first common electrode 24, so that the light is allowed to pass through such area. In an area other than the light-transmitting hole 21, there is no voltage between the first pixel electrode 23 and the first common electrode 24, so that the light is blocked in such area.

When the light-transmitting hole forming layer 20 forms a light-transmitting hole 21 in an ADS (Advanced Super Dimension Switch) mode, the light-transmitting hole forming layer 20 is in a white state in the case of being powered off, and is in a black state in the case of being powered on. When the light-transmitting hole forming layer 20 is switched to the pinhole state, in an area where the light-transmitting hole 21 is located, there is no voltage between the first pixel electrode 23 and the first common electrode 24, so that the light is allowed to pass through such area. In an area other than the light-transmitting hole 21, there is a voltage between the first pixel electrode 23 and the first common electrode 24, so that the light is blocked in such area.

The embodiment of this disclosure utilizes the first pixel electrode 23 and the first common electrode 24 to drive and deflect the first liquid crystal layer 22, such that the light-transmitting hole forming layer 20 is switchable between the light-transmitting state and the pinhole state. Such a technology is mature and does not affect normal display of the display device.

In one or more embodiments, as shown in FIG. 2, the liquid crystal lens layer 30 comprises a second liquid crystal layer 32 sealed in a second cavity 32, and a second pixel electrode 33 and a second common electrode 34 for driving the second liquid crystal Layer 32. The second pixel electrode 33 and the second common electrode 34 are used for driving the second liquid crystal Layer 32 to be switched between the non-lens state and the lens state.

In addition, the liquid crystal lens Layer 30 further comprises a fifth substrate arranged on a side of the second liquid crystal layer 32 near the display panel 1 and a sixth substrate arranged on a side of the second liquid crystal layer 32 away from the display panel 1.

The embodiment of this disclosure utilizes the second pixel electrode 33 and the second common electrode 34 to drive and deflect the second liquid crystal layer 32, such that the liquid crystal lens layer 30 is switchable between the non-lens state and the lens state. Such a technology is mature and does not affect normal display of the display device.

Figure 8:
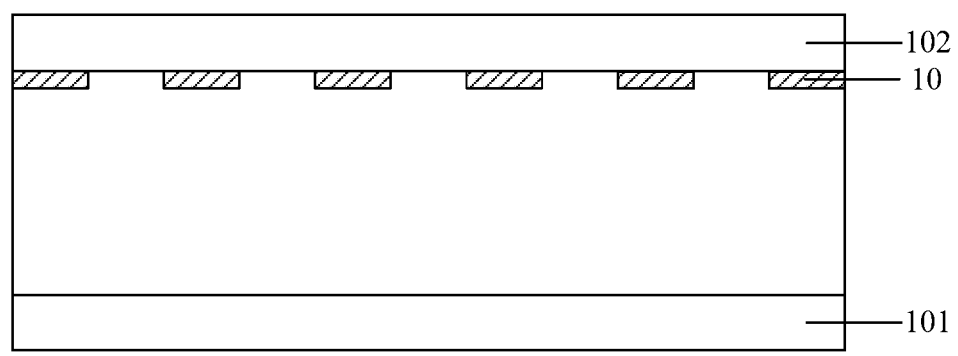
FIG. 8 is a first diagram showing a structure of a display panel provided in an embodiment of this disclosure.
Figure 9:
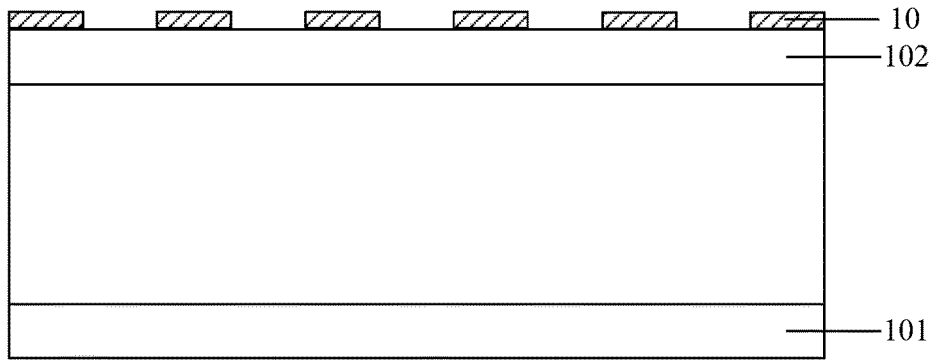
FIG. 9 is a second diagram showing a structure of a display panel provided in an embodiment of this disclosure.

In one or more embodiments, as shown in FIG. 8 and FIG. 9, the display Panel 1 comprises a first substrate 101 and a second substrate 102 arranged in a cell-aligned manner, wherein the second substrate 102 is arranged near the light-transmitting hole forming layer 20 than the first substrate 101, and a plurality of photosensitive sensing units 10 are arranged on the second substrate 102.

It should be noted that, as shown in FIG. 8, the plurality of photosensitive sensing units 10 can be arranged on a side of the second substrate 102 near the first substrate 101. In one or more embodiments, as shown in FIG. 9, the plurality of photosensitive sensing units 10 can also be arranged on a side of the second substrate 102 away from the first substrate 101.

In an embodiment of this disclosure, as compared to the setting that the plurality of photosensitive sensing units 10 are arranged on the first substrate 101, by arranging the plurality of photosensitive sensing units 10 on the second substrate 102, attenuation in light energy when the light passes through the display panel 1 can be avoided.

In addition, the plurality of photosensitive sensing units 10 can also be arranged on a side of the first substrate 101 near the second substrate 102, or on a side of the first substrate 101 away from the second substrate 102.

Based on the above, the substrate in the display device comprises: the first substrate 101 and the second substrate 102 in the display panel 1, the third substrate and the fourth substrate in the light-transmitting hole forming layer 20, and the fifth substrate and the sixth substrate in the liquid crystal lens layer 30. Further, a light guide layer 40 is comprised. Some of the substrates can be shared, and it can be specifically classified into the following four cases:

First case: the display device comprises six substrates, namely: the first substrate 101, the second substrate 102, the third substrate, the fourth substrate, the fifth substrate, and the sixth substrate.

Second case: the display device comprises five substrates, wherein the light guide layer 40 is used as the sixth substrate.

Third case: the display device comprises four substrates, wherein the liquid crystal of the first liquid crystal layer 22 is a cholesteatoma liquid crystal or PDLC. In one or more embodiments, the first polarizer 25 is arranged on a side of the third substrate near the fourth substrate, the second polarizer 26 is arranged on a side of the fourth substrate near the third substrate, then the third substrate and the second substrate 102 are shared, and the fourth substrate and the fifth substrate are shared.

Fourth case: the display device comprises three substrates, wherein the light guide layer 40 is used as the sixth substrate, the third substrate and the second substrate 102 are shared, and the fourth substrate and the fifth substrate are shared.

Figure 10:
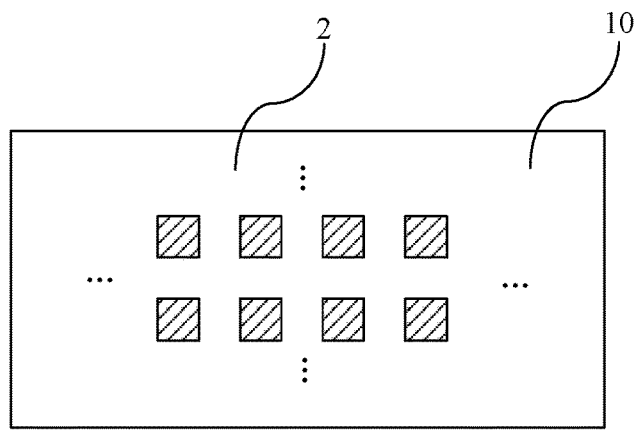
FIG. 10 is a first diagram showing a setting of a plurality of photosensitive sensing units provided in an embodiment of this disclosure.

In one or more embodiments, as shown in FIG. 10, the plurality of photosensitive sensing units 10 are evenly distributed in an array, a total region occupied by the plurality of photosensitive sensing units 10 in the display panel 1 is a sensing region, and a region in the display region of the display panel 1 other than the sensing region is a light exit region 2. An area ratio of the sensing region to the light exit region 2 can be greater than or equal to 1:4, and less than or equal to 1:1.

In the embodiment of this disclosure, by arranging the plurality of sensing units 10 in an array, the plurality of photosensitive sensing units 10 can be evenly arranged in the display panel 1, and for the finger touching any position on the display side of the display device, fingerprint identification is available. By setting an area ratio of the sensing region to the light exit region 2 in a range greater than or equal to 1:4, and less than or equal to 1:1, in this range of area ratio, when the display device is used for display, normal display of the display device will not be affected due to the reduction of the aperture ratio.

On this basis, in one or more embodiments, the area ratio of the sensing region to the light exit region 2 is equal to 1:1, and a best fingerprint identification effect is attained without affecting normal display of the display device.

Figure 11:
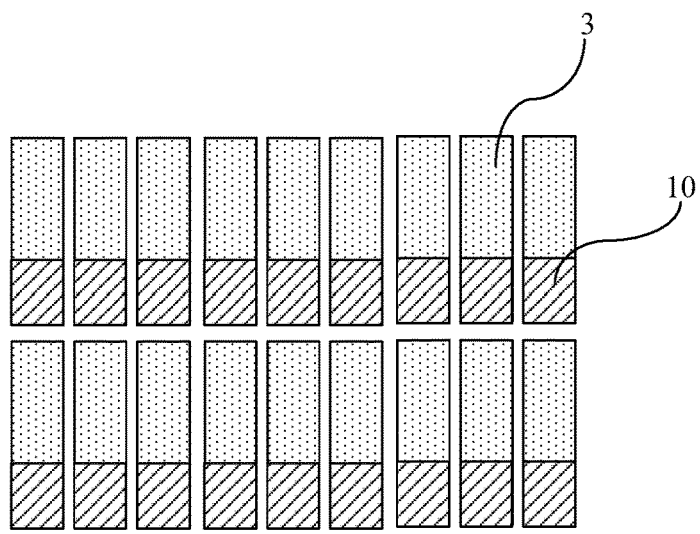
FIG. 11 is a second diagram showing a setting of a plurality of photosensitive sensing units provided in an embodiment of this disclosure.
Figure 12A:
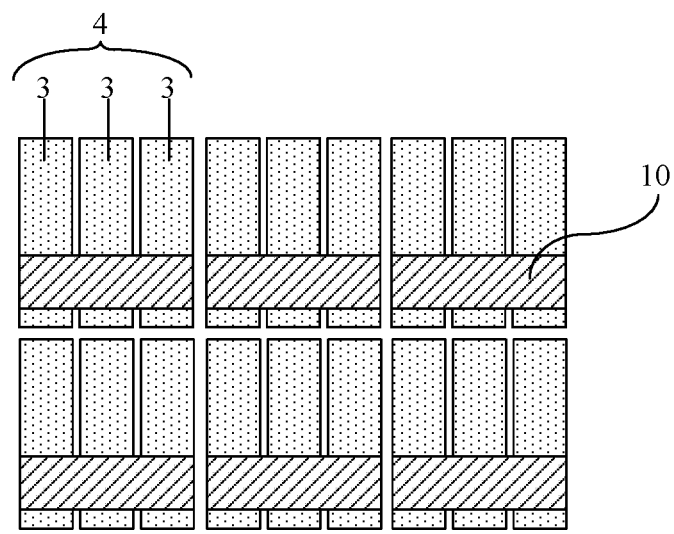
FIG. 12(a) is a third diagram showing a setting of a plurality of photosensitive sensing units provided in an embodiment of this disclosure.
Figure 12B:
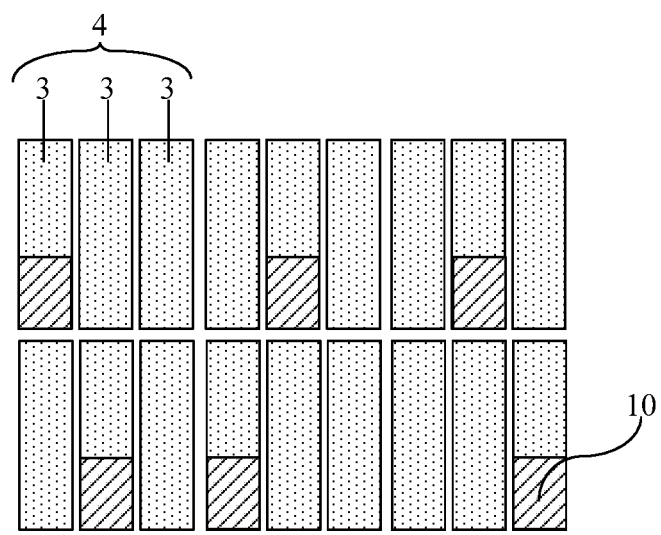
FIG. 12(b) is a fourth diagram showing a setting of a plurality of photosensitive sensing units provided in an embodiment of this disclosure.

In one or more embodiments, an area ratio of a region occupied by each photosensitive sensing unit 10 in the display panel 1 to the pixel region 4 (as shown in FIGS. 12(a) and 12(b)) or the sub-pixel region 3 (as shown in FIG. 11) of the display panel 1 is greater than or equal to 1:4, and less than or equal to 1:1.

Specifically, for a color display device, the pixel region 4 refers to a smallest repeating region in which a variety of colors can be rendered, the sub-pixel region 3 refers to a region in the pixel region 4 for rendering one primary color, and the pixel region 4 generally comprises at least three sub-pixel regions 3. Illustratively, the sub-pixel region 3 can be a red sub-pixel region, a green sub-pixel region, or a blue sub-pixel region. The pixel region 4 can be a region that at least includes one red sub-pixel region, one green sub-pixel region, and one blue sub-pixel region. For a monochromatic device, the pixel region 4 includes one sub-pixel region 3, and the size of the pixel region 4 is the size of the sub-pixel region 3.

It should be noted that, the photosensitive sensing unit 10 can correspond, at a one-to-one basis, to each pixel region 4 or each sub-pixel region 3 in the display panel 1, or the photosensitive sensing unit 10 can be arranged in partial pixel regions 4 or partial sub-pixel regions 3 in the display panel 1, as long as the size of the area where the plurality photosensitive sensing units 10 are located can be used for fingerprint identification.

In an embodiment of this disclosure, each photosensitive sensing unit 10 is set with one pixel or one sub-pixel in the display panel 1 as one unit, so that the plurality of photosensitive sensing units 10 are evenly arranged in the display panel 1. An area ratio of a region occupied by each photosensitive sensing unit 10 in the display panel 1 to the pixel region 4 or sub-pixel region 3 is greater than or equal to 1:4, and less than or equal to 1:1. In this range of area ratio, when the display device is used for display, the normal display of the display device will not be affected due to the reduction of the aperture rate.

On this basis, in one or more embodiments, an area ratio of a region occupied by each photosensitive sensing unit 10 in the display panel 1 to the pixel region 4 or sub-pixel region 3 of the display panel 1 is equal to 1:1, and a best fingerprint identification is attained without affecting normal display of the display device.

By considering that the lack of fingerprint information possibly will result in inaccurate fingerprint identification, in case where a center of the photosensitive sensing unit 10, a center of the light-transmitting hole 21 facing the photosensitive sensing unit 10, and a center of the convex lens 31 facing the photosensitive sensing unit 10 are on a same vertical connection line, in one or more embodiment, as shown in FIG. 4, when the liquid crystal lens layer 30 is in a lens state, adjacent convex lenses 31 are arranged to adjoin one another in a direction parallel to the display panel 1.

In one or more embodiments, as shown in FIG. 4, an aperture of each convex lens 31 is D0, a vertical distance from the center of the convex lens 31 to the center of the light-transmitting hole 21 facing the convex lens is H0, and a vertical distance from the center of the light-transmitting hole 21 to the photosensitive sensing unit 10 facing the light-transmitting hole 21 is H1, and a width range of the photosensitive sensing unit 10 is greater than or equal to $$\frac{D0 \cdot H1}{H0},$$

where $$\frac{H1}{H0} \leq 1.$$

Specifically, as shown in FIG. 4, if adjacent convex lenses 31 are arranged to adjoin one another in the direction parallel to the display panel 1, then the aperture D0 of one convex lens 31 is equal to a sum of the width r of the light-transmitting hole 21 and a width d of a non-light-transmitting region between adjacent light-transmitting holes 21. As compared to the width d of the non-light-transmitting region between adjacent light-transmitting holes 21, the width r of the light-transmitting hole 21 is very small and thus is negligible. Therefore, the aperture D0 of the convex lens 31 is approximately equal to the width d of the non-light-transmitting region between adjacent light-transmitting holes 21, i.e., D0=d.

It is known that the vertical distance from the center of the convex lens 31 to the center of the light-transmitting hole 21 facing it is H0, and the aperture of the convex lens 31 is D0, then the degree θ of the maximum angle formed by the light passing through the light-transmitting hole 21 when it passes through the convex lens 31 is solved. According to the sine theorem, $$\tan\frac{\theta}{2} = \frac{\frac{D0}{2}}{H0} = \frac{D0}{2H0}.$$

On this basis, the vertical distance H1 from the center of the light-transmitting hole 21 to the photosensitive sensing unit 10 facing it and the θ value are known, then a maximum width D1 of the light passing through the light-transmitting hole 21 on the plane where the photosensitive sensing unit 10 is located is solved. According to the sine theorem, it can be known that $$\tan\frac{\theta}{2} = \frac{\frac{D1}{2}}{H1} = \frac{D1}{2H1},$$

so it can be derived that $$D1 = \frac{D0 \cdot H1}{H0}.$$

When the adjacent photosensitive sensing units 10 are arranged to adjoin one another, the width of the photosensitive sensing unit 10 is equal to a sum of the width r of the light-transmitting hole 21 and the width d of the non-light-transmitting region between the adjacent light-transmitting holes 21. As compared to the width d of the non-light-transmitting region between the adjacent light-transmitting holes 21, the width r of the light-transmitting hole 21 is very small and thus is negligible. Therefore, the width of the photosensitive sensing unit 10 is approximately equal to the width d of the non-light-transmitting region between the adjacent light-transmitting holes 21. At this time, in order to make the light that is incident through the light-transmitting hole 21 to the plane where the photosensitive sensing unit 10 is located does not overlap, the width of the photosensitive sensing unit 10 should be greater than or equal to the value of D1, that is, the width range of the photosensitive sensing unit 10 is greater than or equal to $$\frac{D0 \cdot H1}{H0},$$

then the formula $$d \geq \frac{D0 \cdot H1}{H0}$$

is derived. According to the above relation, it can be known that D0=d, therefore $$D0 \geq \frac{D0 \cdot H1}{H0},$$

which can be simplified as $$\frac{H1}{H0} \leq 1.$$

It should be noted that, according to the observer's different viewing position, as well as a different sectioning position of the section plane, the observer saw a different section view, and for the sake of description, in the embodiment of this disclosure, the aperture of the convex lens 31 and the width of the light-transmitting hole 21 are D0 and r in FIG. 4, respectively.

Illustratively, when the orthographical projection of the light-transmitting hole 21 on a lower surface of the light guide layer 40 is circular, the width r of the light-transmitting hole 21 represents the diameter of the circle. When the orthographical projection of the light-transmitting hole 21 on the lower surface of the light guide layer 40 is elliptical, the width r of the light-transmitting hole 21 represents the longer axis or shorter axis of the ellipse. When the orthographical projection of the light-transmitting hole 21 on the lower surface of the light guide layer 40 is square, the width r of the light-transmitting hole 21 represents a side length of one side of the square.

When the orthographical projection of the convex lens 31 on the lower surface of the light guide layer 40 is circular, if the surfaces of the convex lens 31 near and away from the lower bottom surface of the light guide layer 40 are curved surfaces, the aperture D0 of the convex lens 31 represents the diameter of the circle. If the surface of the convex lens 31 away from the lower bottom surface of the light guide layer 40 includes a flat plane, the aperture D0 of the convex lens 31 represents the diameter of the plane. When the orthographical projection of the convex lens 31 on the lower surface of the light guide layer 40 is elliptical, if the surfaces of the convex lens 31 near and away from the lower bottom surface of the light guide layer 40 are curved surfaces, the aperture D0 of the convex lens 31 represents the longer axis or shorter axis of the ellipse. If the surface of the convex lens 31 away from the lower bottom surface of the light guide layer 40 includes a flat plane, the aperture D0 of the convex lens 31 represents the longer axis or shorter axis of the plane. When the orthographical projection of the convex lens 31 on the lower surface of the light guide layer 40 is square, if the surfaces of the convex lens 31 near and away from the lower bottom surface of the light guide layer 40 are curved surfaces, the aperture D0 of the convex lens 31 represents a side length of one side of the square. If the surface of the convex lens 31 away from the lower bottom surface of the light guide layer 40 includes a flat plane, the aperture D0 of the convex lens 31 represents a side length of one side of the plane.

In an embodiment of this disclosure, when the width of the photosensitive sensing unit 10 is greater than or equal to $$\frac{D0 \cdot H1}{H0} \text{ and } \frac{H1}{H0} \leq 1,$$

it can not only avoid the lack of fingerprint information, but also obtain the effect that, when the adjacent photosensitive sensing units 10 are arranged to adjoin one another, the light through the light-transmitting hole 21 and incident to the plane where the photosensitive sensing unit 10 is located does not overlap. This avoids the interference with fingerprint identification caused by the light overlapping, resulting in inaccurate fingerprint identification.

The embodiment of this disclosure further provides a control method for the display device as described in any of the foregoing embodiments of this disclosure, wherein the display device comprises a control module.

After the control module receives a fingerprint identification signal, it controls the light-transmitting hole forming layer 20 in a fingerprint identification region to be switched to a pinhole state and the liquid crystal lens layer 30 to be switched to a lens state, and causes the display device to perform fingerprint identification based on the light guide layer 40, the light source 41 arranged on a side of the light guide layer 40, and the plurality of photosensitive sensing units 10.

After the control module receives a display signal, it controls the light-transmitting hole forming layer 20 to be switched to a light-transmitting state and the liquid crystal lens layer 30 to be switched to a non-lens state, and causes the display device to display.

It should be noted that, the fingerprint identification region can be the display region of the display panel 1 or smaller than the display region of the display panel 1. When the fingerprint identification region is the display region of the display panel 1, if the control module receives the fingerprint identification signal, any location in the display region can be used for fingerprint identification. When the fingerprint identification region is smaller than the display region of the display panel 1, the fingerprint identification region can be used for fingerprint identification, and a region in the display region of the display panel 1 other than the fingerprint identification region can be used for display.

Embodiments of this disclosure provide a control method for a display device comprising a display panel 1, wherein a light-transmitting hole forming layer 20, a liquid crystal lens layer 30, and a light guide layer 40 are arranged on a display side of the display panel 1 and in sequence in a direction away from the display panel 1, and a light source 41 is arranged on a side of the light guide layer 40. When the display device is used only for display, the light-transmitting hole forming layer 20 is switched to the light-transmitting state, the liquid crystal lens layer 30 is switched to the non-lens state, to cause the display device to display. When the display device is used for fingerprint identification, the light-transmitting hole forming layer 20 in the fingerprint identification region can be switched to the pinhole state, the liquid crystal lens layer 30 can be switched to the lens state, and the regions in the display region of the display panel 1 other than the fingerprint identification region still can be used for normal display. The light emitted by the light source 41 is incident from the light guide layer 40 to the finger, diffusely reflected by the finger, and then gathered by the convex lens 31 of the liquid crystal lens layer 30, thereby increasing the light energies from the valley and ridge. With the increase of the light energies from the valley and ridge, a difference between the light energies from them increases as well. The light passing through the convex lens 31 then passes through the light-transmitting hole 21 of the light-transmitting hole forming layer 20, so that the gathered light is incident to a plurality of photosensitive sensing units 10 through the light-transmitting hole 21. Thus, light interference from the areas other than the light-transmitting hole 21 can be eliminated. By increasing the difference between the light energies from the valley and ridge, and eliminating the light interference from the areas other than the light-transmitting hole 21, the present disclosure can accurately identify the fingerprint.

Only specific embodiments of this disclosure are described above, but the scope of protection of this disclosure is not restricted thereto, and persons of ordinary skill in the art could readily conceive of various variations or substitutions within the technical scope revealed by this disclosure, and all these variations or substitutions shall be within the scope of protection of this disclosure. Therefore, the scope of protection of this disclosure shall be determined by the scope of protection of the claims.

What is claimed is:

1. A display device, comprising a display panel including a plurality of photosensitive sensing units, and the display device further comprising: a light-transmitting hole forming layer, a liquid crystal lens layer, and a light guide layer arranged on a display side of the display panel and in sequence in a direction away from the display panel, and a light source arranged on a side of the light guide layer, wherein the light-transmitting hole forming layer is configured to be switchable between a light-transmitting state and a pinhole state, wherein the pinhole state is a state in which the light-transmitting hole forming layer form light-transmitting holes facing each photosensitive sensing unit;

the liquid crystal lens layer is configured to be switchable between a non-lens state and a lens state, wherein the lens state is a state in which the liquid crystal lens layer forms convex lenses facing each photosensitive sensing unit, wherein for a respective photosensitive sensing unit of the plurality of photosensitive sensing units, a center of the respective photosensitive sensing unit, a center of the light-transmitting hole facing the respective photosensitive sensing unit, and a center of the convex lens facing the respective photosensitive sensing unit are on a same respective vertical connection line, when the liquid crystal lens layer is in the lens state, adjacent convex lenses are arranged to adjoin one another in a direction parallel to the display panel, and an aperture of each convex lens is D0, a vertical distance from the center of the convex lens to the center of the light-transmitting hole facing the convex lens is H0, and a vertical distance from the center of the light-transmitting hole to the photosensitive sensing unit facing the light-transmitting hole is H1, and a width range $$\frac{D0 \cdot H1}{H0}$$

of the photosensitive sensing unit is greater than or equal to where $$\frac{H1}{H0} \leq 1.$$

2. The display device according to claim 1, wherein a light emitted by the light source enters the light guide layer and is incident to an upper bottom surface and a lower bottom surface of the light guide layer, Wherein a degree of an incidence angle of the light incident to the upper bottom surface and the lower bottom surface of the light guide layer is greater than or equal to a degree of a critical angle of the light guide layer.

3. The display device according to claim 1, wherein the light-transmitting hole forming layer comprises a first liquid crystal layer sealed in a first cavity, and a first pixel electrode and a first common electrode for driving the first liquid crystal layer, wherein the first pixel electrode and the first common electrode are at least arranged in a region other than the light-transmitting hole.

4. The display device according to claim 1, wherein the liquid crystal lens layer comprises a second liquid crystal layer sealed in a second cavity, and a second pixel electrode and a second common electrode for driving the second liquid crystal layer;

wherein the second pixel electrode and the second common electrode are used for driving the second liquid crystal layer to be switched between the non-lens state and the lens state.

5. The display device according to claim 1, wherein the display panel comprises a first substrate and a second substrate arranged in a cell aligned manner, wherein the second substrate is arranged nearer the light-transmitting hole forming layer than the first substrate, wherein the plurality of photosensitive sensing units are arranged on the second substrate.

6. The display device according to claim 1, wherein the plurality of photosensitive sensing units are evenly distributed in an array, a total region occupied by the plurality of photosensitive sensing units in the display panel is a sensing region, and a region in the display region of the display panel other than the sensing region is a light exit region.

7. The display device according to claim 6, wherein an area ratio of the sensing region to the light exit region is greater than or equal to 1:4, and less than or equal to 1:1.

8. The display device according to claim 6, wherein an area ratio of a region occupied by each photosensitive sensing unit in the display panel to a pixel region or sub-pixel region of the display panel is greater than or equal to 1:4, and less than or equal to 1:1.

9. The display device according to claim 1, wherein the photosensitive sensing unit further comprises a light blocking layer arranged on a side of each photosensitive sensing unit away from the light-transmitting hole forming layer.

10. A method of controlling a display device, the display device comprising a display panel including a plurality of photosensitive sensing units, and the display device further comprising: a light-transmitting hole forming layer, a liquid crystal lens layer, and a light guide layer arranged on a display side of the display panel and in sequence in a direction away from the display panel, and a light source arranged on a side of the light guide layer, wherein the light-transmitting hole forming layer is configured to be switchable between a light-transmitting state and a pinhole state, wherein the pinhole state is a state in which the light-transmitting hole forming layer form light-transmitting holes facing each photosensitive sensing unit;

the liquid crystal lens layer is configured to be switchable between a non-lens state and a lens state, wherein the lens state is a state in which the liquid crystal lens layer forms convex lenses facing each photosensitive sensing unit, wherein the control method comprises:

after receiving a fingerprint identification signal, controlling the light-transmitting hole forming layer in a fingerprint identification region to be switched to the pinhole state and the liquid crystal lens layer to be switched to the lens state, and causing the display device to perform fingerprint identification based on the light guide layer, the light source arranged on the side of the light guide layer, and the plurality of photosensitive sensing units;

after receiving a display signal, controlling the light-transmitting hole forming layer to be switched to the light-transmitting state and the liquid crystal lens layer to be switched to the non-lens state, and causing the display device to perform display.

* * * * *